United States Patent [19]

Monett

[11] Patent Number: 4,603,299
[45] Date of Patent: Jul. 29, 1986

[54] CONSTANT DUTY CYCLE PEAK DETECTOR

[75] Inventor: Michael R. Monett, Santa Clara, Calif.

[73] Assignee: Memory Technology, Inc., Santa Clara, Calif.

[21] Appl. No.: 785,033

[22] Filed: Oct. 7, 1985

Related U.S. Application Data

[63] Continuation of Ser. No. 401,504, Jul. 26, 1982, abandoned.

[51] Int. Cl.[4] .................. H03K 5/00; H03K 17/56
[52] U.S. Cl. .................... 328/151; 307/246; 307/351; 307/359
[58] Field of Search ........... 307/246, 234, 350, 530, 307/351, 352, 359, 264, 270, 267, 265; 328/151, 111

[56] References Cited

U.S. PATENT DOCUMENTS

| | | |
|---|---|---|
| 3,281,686 | 10/1966 | Cochran ............................ 307/351 |
| 3,287,570 | 11/1966 | Wilson ............................... 307/351 |
| 3,375,501 | 3/1968 | McCutcheon et al. ............ 307/351 |
| 3,428,829 | 2/1969 | Haynie et al. ..................... 307/352 |
| 3,822,399 | 7/1974 | Grund et al. ..................... 307/351 |
| 3,893,180 | 7/1975 | Braun et al. ...................... 307/351 |
| 3,939,365 | 2/1976 | Lindgren .......................... 307/351 |
| 4,016,498 | 4/1977 | Hadley .............................. 307/265 |
| 4,121,119 | 10/1978 | Meigs et al. ...................... 307/351 |
| 4,420,698 | 12/1983 | Raadsen ............................ 307/351 |

Primary Examiner—Stanley D. Miller
Assistant Examiner—Timothy P. Callahan
Attorney, Agent, or Firm—Townsend & Townsend

[57] ABSTRACT

A signal detector whose output voltage approximates the true average to peak value of an applied signal of a generally arbitrary waveform employs current sources to regulate the charge-discharge duty cycle of an integrating storage device. The integrating storage device, such as an integrating capacitor, is employed in a high gain circuit with negative feedback to develop a signal representative of the peak level of the applied signal. The device approaches true peak detection over a wide dynamic and frequency operating range relative to known prior art at peak detection devices.

12 Claims, 3 Drawing Figures

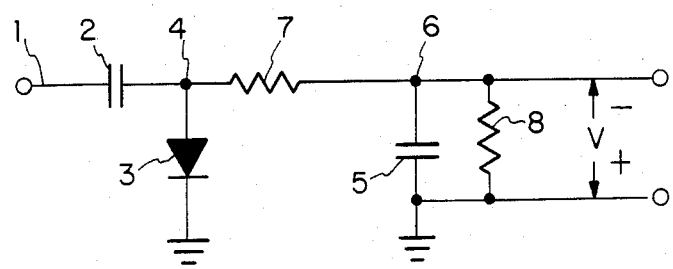
FIG._1 (PRIOR ART)
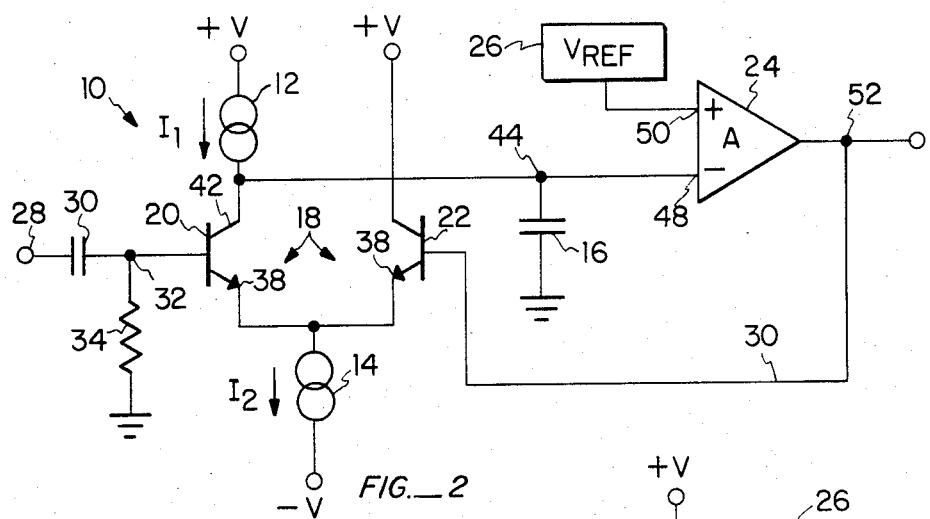
FIG._2
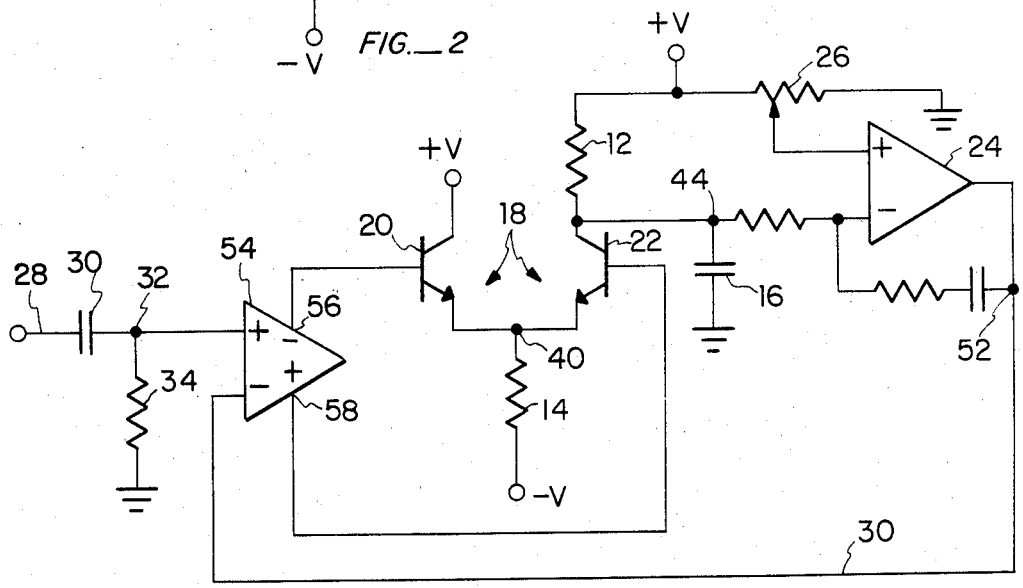
FIG._3

CONSTANT DUTY CYCLE PEAK DETECTOR

This is a continuation of application Ser. No. 06/401,504, filed July 26, 1982, now abandoned.

BACKGROUND OF THE INVENTION

1. Field of Invention

This invention relates to circuitry for detecting peak levels of signals and particularly peak detectors for analyzing signals of generally arbitrary wave shape and form.

Peak signal detectors are widely known and useful circuit devices. A peak detector may be used as an AC signal to DC signal converter, as a demodulator or as a diagnostic tool.

Various circuit solutions have been suggested for providing peak signal indications. Among them are peak envelope detectors, sample and hold circuits and level sensing circuits. Known solutions have a wide variety of limitations and disadvantages, including limitations on large amplitude operating range and frequency range and inability to approach true peak level detection. What is needed is a peak detector which approaches true peak detection over a wide frequency range and large amplitude operating range.

2. Description of the Prior Art

FIG. 1 illustrates one example of a typical prior art peak detector. A signal applied to node 1 through a capacitor 2 is rectified by a diode 3 coupled between node 4 and a ground reference level causing a charge to develop across an integrating capacitor 5 thereby to raise the average voltage level at a node 6 toward a peak level relative to ground corresponding to the peak amplitude of the signal applied at node 1. A discharge resistor 8 may be provided across the integrating capacitor 5. The charge-discharge rate of the integrating capacitor 5 is a function of the time constant determined by the values of resistor 7 and 8 and integrating capacitor 5 modified by the on impedance and off impedance of the diode 3.

The circuit of FIG. 1 has numerous limitations typical of the prior art. For example, the time constants determining the charge and discharge rate of the integrating capacitor 5 tend to vary with the impedance of the diode 3, which in turn is affected by temperature and by input signal operating region. Further, the discharge time constant of the integrating capacitor 5 is such that the circuit is generally not capable of tracking dynamic variations in peak output over a wide frequency range. Such limitations render this type of detector unsuitable for high speed, high precision applications.

SUMMARY OF THE INVENTION

According to the invention, a signal detector whose output voltage approximates the true peak value of an applied signal of an arbitrary waveform employs current sources to regulate the charge-discharge duty cycle of a peak level storage device such as an integrating capacitor. The device approaches true peak detection over a wide amplitude operating range and frequency operating range.

In a particular embodiment, a differential amplifier is employed to switch constant currents of a predetermined ratio alternatively into and out of an integrating capacitor. A high gain amplifier is operative to amplify the difference voltage between a reference and the voltage level stored in the capacitor. The amplifier output is representative of the peak signal level to be detected. High gain negative feedback from the high gain amplifier to the differential amplifier is employed to adjust an equilibrium level of the integrating capacitor and to maintain a constant duty cycle based on the ratio of current which controls the charge and discharge rate of the integrating capacitor. In particular, according to the invention, it is desired to maintain a relatively low charge rate to discharge rate ratio as compared to other solutions which suggest away from a generally low charge rate ratio.

Among the features of this invention is that the feedback forces the device to switch at a duty cycle proportional to the ratio of currents when the device is equilibrium. Another feature of the invention is a switching threshold which is automatically adjusted to maintain an equilibrium state over a wide dynamic range.

A still further feature of the invention is a peak value established at the output of the high gain amplifier which approaches the true peak to peak value even at very high frequency and further an output signal which is substantially insensitive to nonideal conditions in circuit elements.

These and other features of the invention will be better understood by reference to the following detailed description taken in connection with the accompanying drawings.

BRIEF DESCRIPTION OF THE DRAWINGS

FIG. 1 is a schematic diagram of a basic prior art embodiment of a peak detector.

FIG. 2 is a schematic diagram of a first preferred embodiment of the invention.

FIG. 3 is a schematic diagram of a second preferred embodiment of the invention.

DESCRIPTION OF SPECIFIC EMBODIMENTS

Turning to FIG. 2, there is shown a peak detector 10 according to the invention including a first current source 12, a second current source 14, an integrating capacitor 16, switching means 18 comprising a differential amplifier formed of differentially coupled transistors 20, 22, a high gain amplifier 24 and a reference means 26. At an input node 28 is an input coupling capacitor 30 which shares a node 32 with an input resistor 34 and the base electrode of the transistor 20 in the differential amplifier switching means 18. Other input configurations may be employed to apply a signal to node 32 at the base of transistor 20, as hereinafter explained.

The second current source 14 is coupled to the emitter electrodes 36, 38 at a common node 40. The second current source 12 may be coupled to a negative voltage source when NPN transistors are employed in the circuit. The first current source 12 may be coupled from a positive voltage source to the collector electrode 42 of first transistor 20 at a node 44. The integrating capacitor 16 is coupled between node 44 and a fixed, normally ground, reference. The collector electrode 46 of the second transistor 22 is coupled to a suitable positive voltage source.

The noninverting input 48 of the high gain amplifier 24 is coupled to receive signals at the common node 44. The inverting input 50 is coupled to receive a stable reference from reference means 26, which is preferably a voltage reference. The output of the high gain amplifier 24 is provided at a system output node 52. The signal developed between the output node 52 and ground is the system output signal, which is representative of the average to peak value of an input signal applied at input node 28. A feedback line 30 is coupled between the output node 52 and base electrode of second transistor 22 to regulate the charge-discharge cycle of the integrating capacitor 16, as hereinafter explained.

With reference to FIG. 2, the invention operates as follows: A current is established through the first current source 12, which is directed either through first transistor 20 when it is on or through integrating capacitor 16 through node 44 when the first transistor is off. Assuming a steady state sinusoidal signal has been applied to the input node 28, the base electrode of the first transistor 20 switches alternately on and off. Consequently current through the second current source 14 is directed either through the first transistor 20 or through the second transistor 22, due to the differential action of the switching means 18.

When the first transistor 20 is switched on, current is drawn from the integrating capacitor 16 through the second current source 14. The second current source 14 must invariably provide a higher current than the first current source 12 in order to assure that the integrating capacitor 16 is discharged properly. The first current source 12 may alternatively be placed between node 44 and integrating capacitor 16 in a generalized embodiment.

The voltage level at the common node 44 is monitored at the inverting input 48 of the amplifier 24. The amplifier 24 amplifies any voltage difference between the voltage provided at the common node 44 and the voltage provided through the reference 26 at the noninverting input 50. The amplifier 24 thereby generates an error feedback signal on the feedback line 30 to the base electrode of the second transistor 22. As the voltage at the common node 44 increases above the reference level of the reference 26 in consequence of charge supplied by the first current source 12 into the integrating capacitor 16, a negative feedback error signal on feedback line 30 causes the transistor 22 to switch off forcing the first transistor 20 to switch on and thereby to draw charge off of integrating capacitor 16 through the second current source 14. As the voltage at the common node 44 drops below the reference level at the noninverting input 50, the negative feedback signal on feedback line 30 causes the second transistor 22 to switch on, allowing first transistor 20 to switch off, thereby to cut off the current through the second current source 14 draining charge from the integrating capacitor 16. Thus, the voltage at the common node 44 continually seeks the voltage level established by the reference means 26. Because the first and second current sources 12 and 14 provide controlled current levels, the charge and discharge rates of the integrating capacitor 16 in each switching state of the differential amplifier switching means 18 are also constant. It follows therefore that the duty cycle for the switching of the differential amplifier switching means 18 is constant when the circuit is in equilibrium with the input signal applied at the input node 28.

The signal at the output node 52 will be proportional to the average to peak value of the signal applied at input node 28. With knowledge of ratio of currents of the first current source 12 and the second current source 14, one can compute the expected error between the output signal and the average to peak input signal under sinusoidal conditions by use of the following equation:

$$V_{out} = V_{in} \cos\left[\frac{2\pi d}{2}\right]$$

where
$V_{out}$ is the output voltage at node 52;
$V_{in}$ is the average to peak voltage at node 28; and
d is the duty cycle of second current source 14. Due to symmetry considerations, the effect of the duty cycle on the equation is reduced by half.

For a ratio of currents of 50 to 1, the duty cycle is two percent, and the output voltage will equal 0.998 of the average to peak voltage for a sinusoidal input signal.

For other signals of generally arbitrary waveshape, the output value will closely approximate the average to peak value, since the circuit samples only a relatively small portion of the duty cycle of the input signal around the peak, no matter what the frequency. It should be understood, however, that the duty cycle of the input signal to be examined must exceed the duty cycle of the second current source relative to the first current source.

Referring to FIG. 3, there is shown a second embodiment of the invention. Similar features are designated by the same numerals as in FIG. 2. In the embodiment shown in FIG. 3, a high gain differential amplifier 54 with first and second differential outputs 56, 58 is provided between the input node 32 and the switching means 18. Specifically, a first inverting differential output 56 is provided to the base electrode of the first transistor 20 and a second, noninverting, differential output 58 is provided to the base electrode of the second transistor 22. Feedback from output node 52 on feedback line 30 is provided to an inverting input of the differential amplifier 54. The first current source 12 may be a resistor coupled between a fixed voltage reference +V and the collector of second transistor 22, which will be stabilized at equilibrium at the voltage level of the reference means 26. Depending on the choice of polarities, the first current source 12 may be provided in the collector circuit of either the first transistor 20 or the second transistor 22.

The second current source 14, similarly, may be a resistor, which is coupled between node 40 and a fixed negative voltage reference −V. At equilibrium, the currents through the resistors forming first current source 12 and second current source 14 are sufficiently constant to maintain a fixed current ratio therebetween. Alternatively, other current sources may be employed in the circuit, such as transistor current sources.

The high gain differential amplifier 54 has as its input stage a differential pair, just as the device in FIG. 2. However, the gain introduced by the high gain differential amplifier 54 reduces any error which may introduced by characteristics of the input differential pair, which increases the accuracy and dynamic range of the circuit.

A device according to the invention has a number of advantages over prior art circuits. One of the most important is its insensitivity to changes in ambient conditions. This is achieved by the use of stable, generally fixed current sources to establish the charge rate to discharge rate ratio of the integrating capacitor 16. Moreover, the duty cycle of the integrating capacitor in devices according to the invention is substantially lower than the duty cycle of circuits of the prior art, typically on the order of about 40 to 1 to about 100 to 1. Prior art circuits typically exhibit a charge rate to discharge rate in integrating capacitors on the order of 1000 to 1 to 1 million to 1, which severely limits the ability of such circuits to track the decreasing peaks of a dynamically varying signal. Devices according to the present invention, in contrast, are capable of tracking much more rapidly the peaks of dynamically changing signals.

The devices according to the invention, particularly circuits embodying the high gain input differential amplifier, exhibit good linearity over a wide dynamic range and wide frequency range, unlike circuits of the prior art.

Finally, second order effects in the circuit, such as drift of component values with time and switching characteristics of components are minimized in circuits according to the invention wherein negative feedback is used to establish the functional parameters of the device, such as duty cycle and current ratios.

The invention has now been explained with reference to specific embodiments, Other embodiments will be apparent to those of ordinary skill in the art upon reference to the specification. It is therefore not intended that this invention be limited, except as indicated by the appended claims.

I claim:

1. A circuit apparatus for generating an output signal representative of peak level signals of arbitrary periodic form over a wide frequency range comprising:

means for storing a charge;

reference means forproviding a fixed reference signal for comparison with a varying signal across said charge stroing means;

switching means coupled at a first control input to receive an arbitrary periodic input signal and coupled at a second control input to receive an error signal, said switching means for controlling current to said charge storing means;

means coupled to said switching means for generating a first current for application in a first direction through said charge storing means, said first current generating means providing a first preset current;

means coupled to said switching means for generating a second current for application in a second direction through said charge storing means opposing said first direction of said first current, said second current generator means providing a second preset current greater than said first preset current;

said switching means being connected to said charge storing means and being alternately switched between said first current generating means and said second current generating means at a preset duty cycle independent of said arbitrary input signal to maintain under steady state conditions a constant charge in said charge storing means, said charge being independent of said input signal; and means coupled to said charge storing means and to said reference means for developing said error signal in response to charge of said charge storing means as compared to said reference signal such that said error signal is representative of a constant proportion of the peak value of said arbitrary periodic input signal, said error signal regulating switching of said switching means at said constant duty cycle.

2. The apparatus according to claim 1 wherein said switching means comprises a differential amplifier switch, and wherein said second current generating means comprises a current source coupled to a common node of said differential amplifier switch, said differential amplifier switch being under negative feedback control of said error signal developing means.

3. The apparatus according to claim 2 further including amplifier means for amplifying said input signal.

4. The apparatus according to claim 1 wherein said first current generating means and said second current generating means comprise current sources operating without feedback.

5. The apparatus according to claim 1 wherein said first current generating means and said second current generating means comprise fixed current sources.

6. The apparatus according to claim 5 wherein said fixed current sources are resistors.

7. The apparatus according to claim 5 wherein said current sources are formed of active circuit means.

8. The apparatus according to claim 1 wherein the ratio of said second current to said first current does not exceed about 100 to 1.

9. The apparatus according to claim 4 wherein said first current generating means and said second current generating means comprise current sources operating without feedback.

10. The apparatus according to claim 4 wherein said first current generating means and said second current generating means comprise fixed current sources.

11. The apparatus according to claim 9 wherein said fixed current sources are resistors.

12. The apparatus according to claim 9 wherein said current sources are formed of active circuit means.

* * * * *